(12) United States Patent
Raghuram et al.

(10) Patent No.: US 7,728,318 B2
(45) Date of Patent: Jun. 1, 2010

(54) NONVOLATILE PHASE CHANGE MEMORY CELL HAVING A REDUCED CONTACT AREA

(75) Inventors: Usha Raghuram, San Jose, CA (US); S. Brad Herner, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 201 days.

(21) Appl. No.: 11/560,791

(22) Filed: Nov. 16, 2006

(65) Prior Publication Data

US 2008/0116441 A1   May 22, 2008

(51) Int. Cl.
 *H01L 29/02* (2006.01)
(52) U.S. Cl. .................. 257/2; 257/E29.002; 438/102; 438/103
(58) Field of Classification Search .................. 257/1–5, 257/E29.002; 438/95, 102–103; 365/163
See application file for complete search history.

(56) References Cited

U.S. PATENT DOCUMENTS

| | | | |
|---|---|---|---|
| 5,406,509 | A | 4/1995 | Ovshinsky et al. |
| 5,687,112 | A | 11/1997 | Ovshinsky |
| 5,751,012 | A | 5/1998 | Wolsteinholme et al. |
| 5,825,046 | A | 10/1998 | Czubatyj et al. |
| 5,831,276 | A * | 11/1998 | Gonzalez et al. ............... 257/3 |
| 5,952,671 | A * | 9/1999 | Reinberg et al. ............... 257/3 |
| 6,369,431 | B1 | 4/2002 | Gonzalez et al. |
| 6,563,220 | B2 | 5/2003 | Gonzalez et al. |
| 6,643,159 | B2 | 11/2003 | Fricke et al. |
| 6,670,713 | B2 | 12/2003 | Gonzalez et al. |
| 6,744,088 | B1 | 6/2004 | Dennison |
| 6,937,507 | B2 | 8/2005 | Chen |
| 6,952,030 | B2 | 10/2005 | Herner et al. |
| 6,960,495 | B2 | 11/2005 | Vyvoda et al. |
| 6,984,561 | B2 | 1/2006 | Herner et al. |
| 6,995,422 | B2 | 2/2006 | Herner et al. |
| 7,009,275 | B2 | 3/2006 | Herner et al. |
| 7,026,212 | B2 | 4/2006 | Herner et al. |
| 2001/0001600 | A1 * | 5/2001 | Marr ........................... 365/212 |
| 2004/0113192 | A1 | 6/2004 | Wicker |
| 2005/0029587 | A1 | 2/2005 | Harshfield |
| 2005/0052915 | A1 | 3/2005 | Herner et al. |
| 2005/0098800 | A1 | 5/2005 | Herner et al. |

(Continued)

OTHER PUBLICATIONS

PCT International Search Report for PCT/US2007/084841 filed Nov. 15, 2007.

(Continued)

*Primary Examiner*—Bradley K Smith
*Assistant Examiner*—Jami M Valentine
(74) *Attorney, Agent, or Firm*—Cooper Legal Group LLC

(57) ABSTRACT

A nonvolatile memory cell having a contact area between a phase-change material such as a chalcogenide and a heat source which is smaller than photolithographic limits is described. To form this cell, a conductive or semiconductor pillar is exposed at a dielectric surface and recessed by selective etch. A thin, conformal layer of a spacer material is deposited on the dielectric top surface, the pillar top surface, and the sidewalls of the recess, then removed from horizontal surfaces by anistropic etch, leaving a spacer on the sidewalls defining a reduced volume within the recess. The phase change material is deposited within the spacer, having a reduced contact area to the underlying conductive or semiconductor pillar.

18 Claims, 9 Drawing Sheets

U.S. PATENT DOCUMENTS

| | | |
|---|---|---|
| 2005/0121743 A1 | 6/2005 | Herner |
| 2005/0158950 A1 | 7/2005 | Scheuerlein et al. |
| 2005/0226067 A1 | 10/2005 | Herner et al. |
| 2006/0006495 A1 | 1/2006 | Herner et al. |
| 2006/0054962 A1 | 3/2006 | Dunton et al. |
| 2006/0098472 A1 | 5/2006 | Ahn et al. |
| 2006/0157683 A1 | 7/2006 | Scheuerlein |
| 2006/0266993 A1* | 11/2006 | Suh et al. .................. 257/4 |
| 2006/0273298 A1 | 12/2006 | Petti |
| 2007/0096162 A1 | 5/2007 | Happ et al. |
| 2008/0017894 A1 | 1/2008 | Happ et al. |

OTHER PUBLICATIONS

Office Action dated Apr. 9, 2008 in U.S. Appl. No. 11/560,792.
Office Action dated Oct. 20, 2008 in U.S. Appl. No. 11/560,792.
Office Action dated Mar. 11, 2008 in U.S. Appl. No. 11/560,792.
Final Office Action for U.S. Appl. No. 11/560,792 dated Oct. 20, 2009.
Non-Final Office Action for related U.S. Appl. No. 11/560,792 dated Feb. 4, 2010.

* cited by examiner

NONVOLATILE PHASE CHANGE MEMORY CELL HAVING A REDUCED CONTACT AREA

RELATED APPLICATIONS

This application is related to Raghuram et al., U.S. patent application Ser. No. 11/560,792, "Method of Making a Nonvolatile Phase Change Memory Cell Having a Reduced Contact Area," filed on even date herewith and hereby incorporated by reference.

BACKGROUND OF THE INVENTION

The invention relates to a nonvolatile memory cell including a phase-change element, such as an element formed of a chalcogenide. Heat is required to convert a phase-change element between phases, and heat provided to the phase-change element can be focused by decreasing the contact area between the phase-change element and the heat source. It can be difficult to reduce this contact area below photolithographic limits, however.

There is a need, therefore, for a method to form a contact area that is smaller the minimum feature size that can be formed photolithographically.

SUMMARY OF THE PREFERRED EMBODIMENTS

The present invention is defined by the following claims, and nothing in this section should be taken as a limitation on those claims. In general, the invention is directed to a method to form a reduced contact area between a phase-change element and a heat source in a nonvolatile memory cell, and to the structures formed by such a method.

A first aspect of the invention provides for a nonvolatile memory cell comprising: a pillar comprising a conductive or semiconductor material, the pillar having a pillar sidewall; a dielectric spacer above the pillar, the dielectric spacer having an outer sidewall and an inner sidewall, wherein the outer sidewall is aligned with the pillar sidewall and the inner sidewall defines a reduced recess volume; a phase-change material, wherein some portion of the phase-change material is within the reduced recess volume; and a dielectric fill material surrounding the pillar and the dielectric spacer, wherein the dielectric spacer is formed of a second dielectric material which is different from the dielectric fill material.

Another preferred embodiment provides for a monolithic three dimensional memory array comprising: a) a first memory level, the first memory level comprising: i) a plurality of pillars, each pillar comprising a conductive or semiconductor material, and having a pillar sidewall; ii) a plurality of dielectric spacers, each dielectric spacer above one of the pillars, each dielectric spacer having an outer sidewall and an inner sidewall, wherein the outer sidewall of each spacer is aligned with the pillar sidewall of one of the pillars and each inner sidewall defines a reduced recess volume; iii) a plurality of phase-change elements, wherein some portion of each of the phase-change elements is within the reduced recess volume; and iv) a dielectric fill material surrounding the pillars and the dielectric spacers, wherein the dielectric spacers are formed of a second dielectric material which is different from the dielectric fill material; and b) a second memory level monolithically formed above the first memory level.

Still another preferred embodiment provides for a memory level comprising: a plurality of pillars, each pillar comprising a conductive or semiconductor material, and having a pillar sidewall; a plurality of dielectric spacers, each dielectric spacer above one of the pillars, each dielectric spacer having an outer sidewall and an inner sidewall, wherein the outer sidewall of each spacer is aligned with the pillar sidewall of one of the pillars and each inner sidewall defines a reduced recess volume; a plurality of phase-change elements, wherein some portion of each of the phase-change elements is within the reduced recess volume; and dielectric fill material surrounding the pillars and the dielectric spacers, wherein the dielectric spacers are formed of a second dielectric material which is different from the dielectric fill material.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

While all materials can change phase, in this discussion the term "phase change material" will be used to describe a material that changes relatively easily from one stable phase to another. The phase change is typically from an amorphous state to a crystalline state (or vice versa), but may be an intermediate change, such as from a less-ordered to a more-ordered crystalline state, or vice versa. Chalcogenides are well-known phase change materials.

It is known to use phase change materials, such as chalcogenides, in a nonvolatile memory cell, in which a high-resistance, amorphous state represents one memory state while a low-resistance, crystalline state represents the other memory state, where each memory state corresponds to a value of 1 or 0. If intermediate stable states are achieved, more than two memory states can exist for each cell; for simplicity, the examples in this discussion will describe only two memory states.

A phase change material is converted from one state to the other by heating to high temperature and/or quenching from high temperature quickly. To facilitate this conversion, different approaches have been used to concentrate heat in a relatively small area contacting the phase change material. The present invention provides a simple, easy-to-manufacture solution to the problem of focusing thermal energy in a nonvolatile memory cell comprising a phase change element (an element comprising a phase-change material) by forming a contact area smaller than the feature size, the minimum dimension that can reliably be formed by photolithography, with no precise alignment required.

An embodiment of the present invention will be briefly described.

Figure 1A:
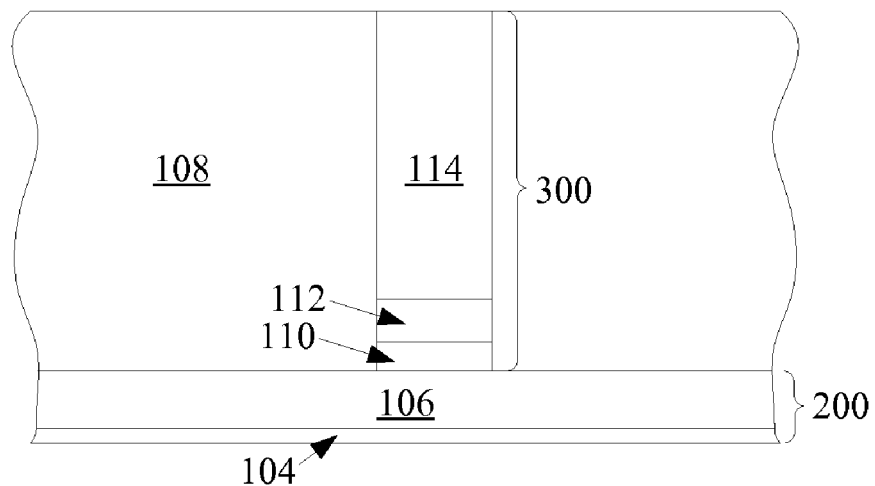
FIGS. 1a through 1g are cross-sectional views showing stages in formation of a memory cell according to a preferred embodiment of the present invention.

FIG. 1a shows a rail-shaped bottom conductor 200 formed by any conventional method. Bottom conductor 200 is preferably formed of metal or metallic material, for example titanium nitride adhesion layer 104 and tungsten layer 106. Above and aligned with bottom conductor 200 is pillar 300. Pillar 300 includes barrier layer 110, which prevents reaction between tungsten layer 106 and overlying semiconductor material. Bottom region 112 is amorphous semiconductor material such as silicon which is heavily doped, for example with an n-type dopant, while region 114 is intrinsic or lightly doped silicon. Dielectric fill material 108 surrounds pillar 300, and the top surface of pillar 300 is exposed, surrounded by dielectric fill material 108 at a planar surface formed by a planarization step, for example, by chemical mechanical planarization, or CMP.

Figure 1B:
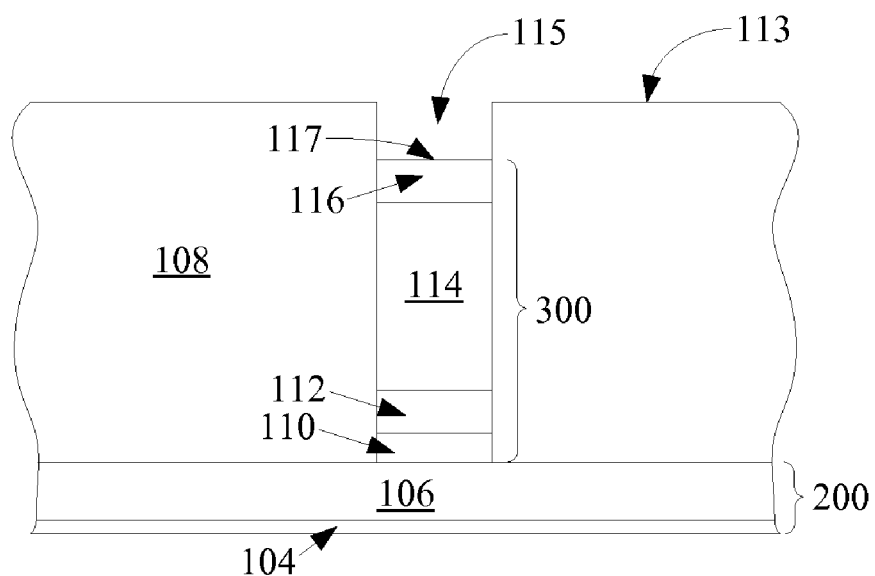

Turning to FIG. 1b, a selective dry etch recesses pillar 300 relative to dielectric fill material 108. Pillar 108 has a pillar top surface 117, which is recessed relative to dielectric fill top surface 113, forming recess volume 115, which occupies space between pillar top surface 117 and fill top surface 113.

Preferably at this point an ion implantation step is performed, forming top heavily doped p-type region 116. Bottom heavily doped n-type region 112, middle intrinsic region 114, and top heavily doped p-type region 116 form a vertically oriented p-i-n diode. If desired, the polarity of this diode could be reversed, with the p-type region on the bottom and the n-type region on the top.

Figure 1C:
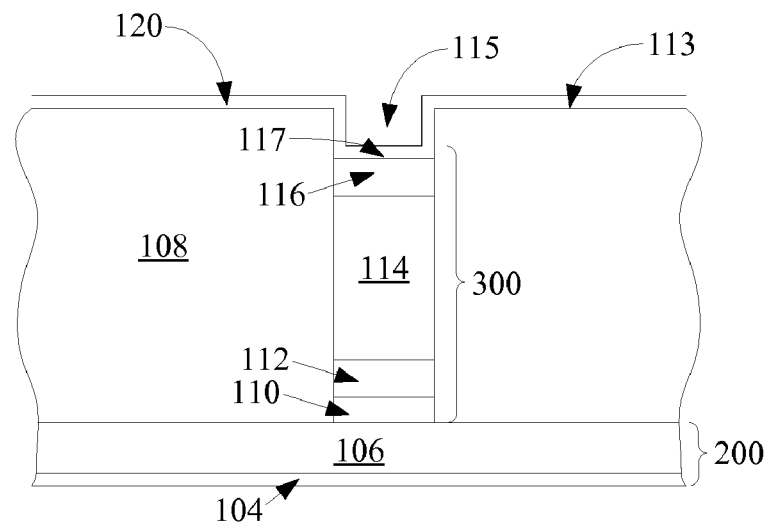
Figure 1D:
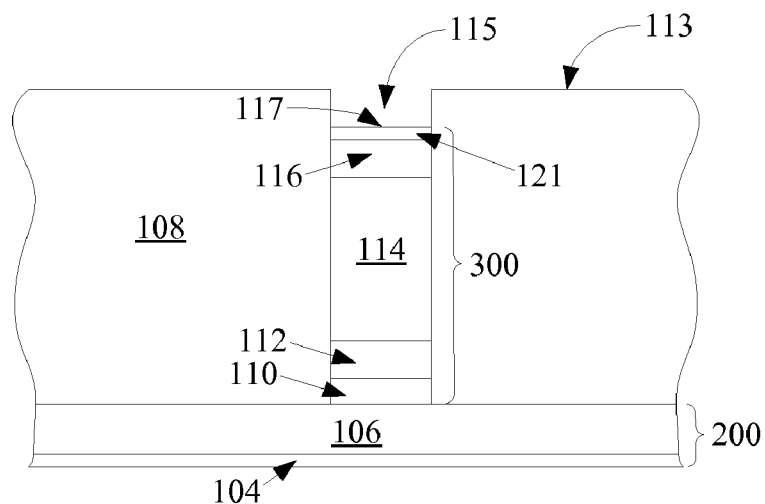

Turning to FIG. 1c, a layer of a silicide-forming metal 120 is deposited on dielectric fill top surface 113, pillar top surface 117, and the sidewalls of recess volume 115. A first anneal causes metal 120 to react with the silicon of heavily doped region 116, forming a layer of metal silicide at the top of pillar 300. Silicide-forming metal 120 may be, for example, cobalt or titanium, forming cobalt silicide or titanium silicide layer 121, shown in FIG. 1d. A selective wet etch strips unreacted cobalt or titanium, leaving silicide 121 only at the top of pillar 300. Preferably a second anneal is performed next to complete the silicide reaction. As will be seen, silicide 121 serves as a barrier between the silicon of top heavily doped region 116 and a phase-change material to be deposited in a later step. Silicide layer 121 also serves to change the character of the diode, as will be described. Note that the top surface of silicide 121 is now the pillar top surface 117.

Figure 1E:
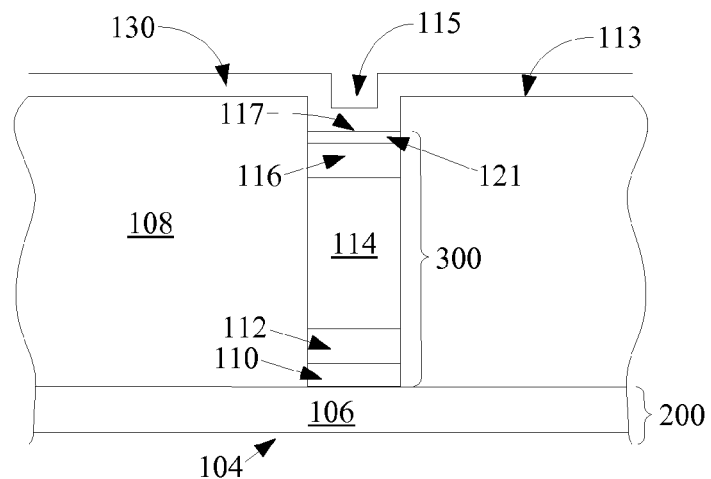
Figure 1F:
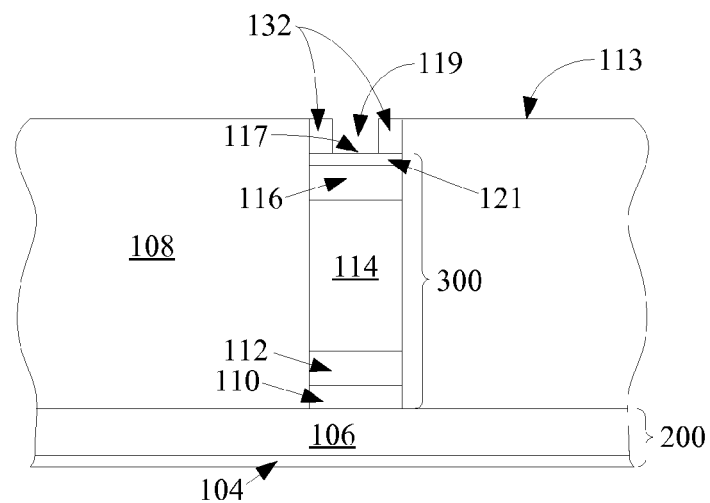

Next, in FIG. 1e, a thin conformal dielectric layer 130 is deposited on the dielectric fill top surface 113, the sidewalls of recess volume 115, and pillar top surface 117. As shown in FIG. 1f, an anistropic etch is performed; the anisotropic etch is largely a vertical etch, with little or no lateral component, so that conformal dielectric layer 130 is removed from horizontal surfaces (dielectric fill top surface 113 and pillar top surface 117), but remains on the vertical (or near-vertical) sidewalls of recess volume 115, forming spacer 132. Spacer 132 is shown in cross-section; it is shaped like a hollow cylinder having an outer sidewall and in inner sidewall. The outer sidewall of spacer 132 is aligned with the sidewall of pillar 300. Spacer 132, specifically its inner sidewall, defines a reduced recess volume 119, smaller than the original recess volume 115 of FIG. 1e.

Figure 1G:
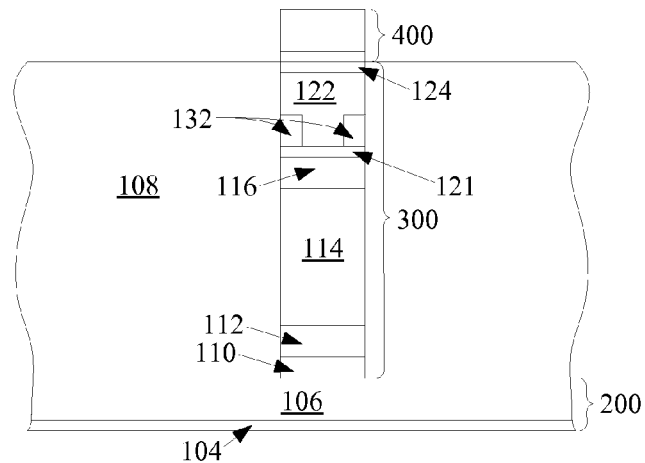

Finally, in FIG. 1g, a layer of a phase-change material 122 is deposited, filling reduced recess volume 119. Phase-change material 122 is preferably a chalcogenide. In this example a CMP stop layer (of titanium nitride, for example) 124 is deposited, then CMP stop layer 124 and chalcogenide 122 are patterned, etched, and surrounded with more dielectric fill 108. After a planarizing step to expose the top of CMP stop layer 124, in this embodiment top conductor 400 is formed above chalcogenide 122. Top conductor 400 can be formed in the same manner and of the same materials as bottom conductor 200. Additional barrier layers, such as barrier 124, may be included. As shown, top conductor 400 preferably extends in a direction perpendicular to bottom conductor 200 (rail-shaped top conductor 400 is shown in cross-section, extending out of the page.)

It will be seen that the presence of spacer 132 reduces the area of contact between chalcogenide 122 and underlying pillar 300. Heat is required to convert a chalcogenide between its amorphous and crystalline phases. Heat is generated in this memory cell by applying a voltage between top conductor 400 and bottom conductor 200. Current flows through the diode of pillar 300, providing heat. The reduced contact area between chalcogenide 122 and the diode of pillar 300, and the reduced volume of chalcogenide 122, confined within the reduced recess volume defined by spacer 132, concentrates current and thus heat, facilitating the phase conversion. If the width of pillar 300 is the feature size, then it will be seen that the width of the reduced recess volume defined by spacer 132 is smaller than the feature size.

As described, the silicon that forms the diode is actually amorphous as deposited. A subsequent anneal will crystallize the diode, which will be polycrystalline in the finished device.

To summarize, in this example, the pillar, recess volume, and dielectric fill material were formed by depositing the semiconductor material; etching the semiconductor material to form the pillar; depositing the dielectric fill material over and surrounding the pillar; planarizing to expose a portion of the pillar; selectively etching the pillar to form the recess volume; and doping a portion of the pillar to form a vertically oriented diode. The diode and the phase-change material are arranged in series between the bottom conductor and the top conductor.

The memory cell shown in FIG. 1g can vary in many ways. For example, silicide layer 121 may be absent, or may be formed following formation of spacer 132 rather than before it. In other embodiments, the pillar 300 may not comprises a diode, and indeed may not be formed of semiconductor material. The method of the present invention can be used to form a reduced contact area to any underlying conductor. In alternative embodiments, the pillar may be formed of some other appropriate conductive material, such as a metal, or conductive metal compound, including metal silicides.

As described in Herner, "Memory Cell Comprising a Semiconductor Junction Diode Crystallized Adjacent to a Silicide," U.S. patent application Ser. No. 10/954,510," filed Sep. 29, 2004, hereinafter the '510 application; and in Herner et al., "Nonvolatile Memory Cell Operating by Increasing Order in Polycrystalline Semiconductor Material," U.S. patent application Ser. No. 11/148,530, filed Jun. 8, 2005, hereinafter the '530 application, both owned by the assignee of the present and invention and hereby incorporated by reference, the character of a polycrystalline silicon or polysilicon diode is affected by how it is formed.

Preferably silicon (or another appropriate semiconductor material) is deposited in an amorphous state, then crystallized by a thermal anneal. As described in the '510 application and the '530 application, it has been found that if the silicon is crystallized in contact only with materials with which it has a large lattice mismatch, such as titanium nitride or silicon dioxide, the resulting polysilicon will have many defects, and will be relatively low-resistivity as formed. When the silicon is subjected to a high voltage or current (by applying a high voltage across the diode, for example) the resistivity of the polysilicon is dramatically reduced. As described in Kumar et al., "Method For Using A Memory Cell Comprising Switchable Semiconductor Memory Element With Trimmable Resistance," U.S. patent application Ser. No. 11/496,986, filed Jul. 28, 2006, owned by the assignee of the present invention and hereby incorporated by reference, this change in resistivity is reversible and repeatable.

It will be recalled that the data state of the memory cell is intended to be stored in the resistivity state of the chalcogenide. It is preferable that if such a cell also includes a semiconductor diode, that the semiconductor material of the diode does not also change resistivity.

As described in the '510 and '530 applications, it has been found that when an amorphous semiconductor material such as silicon is crystallized in contact with a material with which it has a close lattice match at a favorable orientation, such as an appropriate silicide, the silicide provides a crystallization template for the silicon as it crystallizes. The resulting silicon is low-defect, high-quality, and low-resistivity as formed. This low-defect silicon does not appreciably change resistivity when subjected to high voltage or current. A diode formed from silicon crystallized in contact with an appropriate silicide is advantageously used in a memory cell like the cell of FIG. 1g including a semiconductor diode and a chalcogenide. Nearly all change in current flow when a programming voltage is applied across the cell is due to the change in resistivity of the chalcogenide only, which simplifies cell operation and reduces programming voltage. The cell can be rewritten, converting the chalcogenide between amorphous and crystalline states many times without substantially changing the behavior of the diode. Titanium silicide and cobalt silicide are advantageous silicides to provide such a crystallization template, forming high-quality silicon. In some embodiments, the diode may be formed of silicon-germanium. In this case a silicide or a silicide-germanide, for example titanium silicide-germanide or cobalt silicide-germanide, may provide the crystallization template.

In general, in preferred embodiments of the present invention, the diode is formed of silicon or silicon-germanium which has been deposited in an amorphous state and crystallized in contact with a silicide or silicide-germanide with which it as a close lattice match. The silicide layer 121 of FIG. 1g, which is preferably cobalt silicide or titanium silicide, serves this role in the example provided.

The fraction by which the spacer reduces the width, and thus the area, of the contact between the chalcogenide and the pillar top surface is determined by the relationship between the width of the pillar and the deposited thickness of the dielectric conformal layer that will form the spacer.

In general, the processes of photolithography and etch tend to round corners on patterned features. At small feature size, a patterned pillar formed from a square or nearly square feature in a photomask will tend to have a generally cylindrical shape. To a close approximation, then, the top surface of the pillar in the example of FIG. 1g can be considered to be a circle.

Figure 2A:
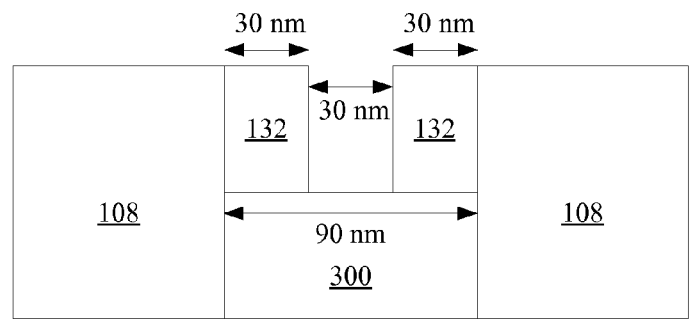
FIGS. 2a through 2c are cross-sectional views illustrating the relationship between pillar width, thickness of the conformal dielectric layer, and the size of the reduced recess volume in various embodiments of the present invention.

As shown in FIG. 2a, for a pillar 300 having a width of 90 nm, for example, if the conformal layer is about 30 nm thick as deposited, the reduced contact area has a width of about 30 nm. The pillar is shown surrounded by dielectric fill material 108. Without spacer 132, the area of the pillar top surface is about 6350 nm. With the spacer 132, the exposed area of the pillar top surface is only about 700 nm². The contact area has been reduced to about 11 percent of the original area.

Figure 2B:
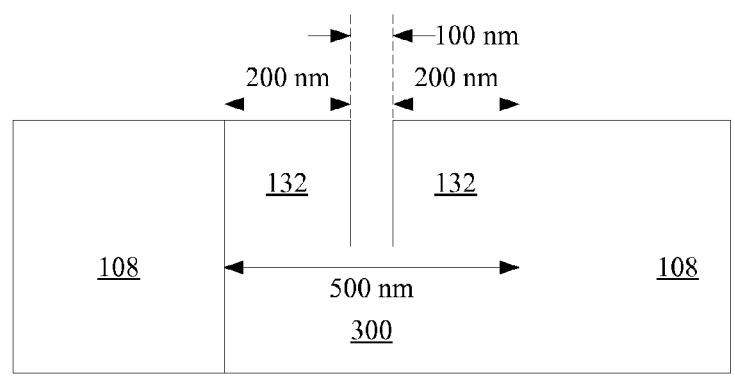

In another example, in FIG. 2b, suppose the pillar has a width of about 500 nm, and the thickness of the conformal layer is about 200 nm. The reduced contact area has a width of about 100 nm. Without spacer 132, the area of the pillar top surface is about 196,000 nm²; with spacer 132, the contact area is only about 7850 nm². The contact area has been reduced to about 4 percent of the original area.

Figure 2C:
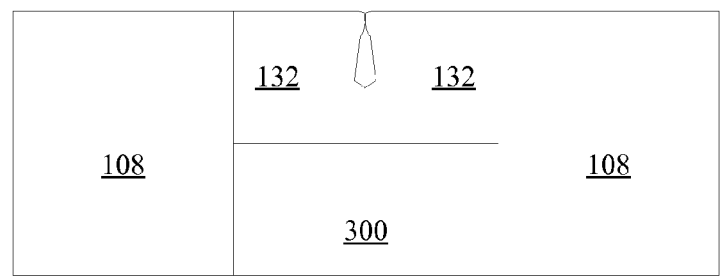

Care must be taken; if the conformal layer is too thick relative to the width of the recess, the conformal layer may pinch off, as in FIG. 2c, and fail to create a void to be filled by phase change material. The percentage by which the area of the contact can be reduced varies with feature size. As examples, for a pillar having a width of about 45 nm, the conformal layer is preferably between about 2.5 and about 20 nm, preferably about 10 nm, leaving a reduced contact area between about 40 and about 5 nm wide, preferably about 25 nm wide. For a pillar having a width of about 25 nm, the conformal layer is preferably between about 2.5 and about 10 nm, preferably about 5 nm, leaving a reduced contact area between about 20 and about 5 nm wide, preferably about 15 nm wide. Many other examples can be imagined; in general the width of the contact area is preferably at least 5 nm wide, more preferably at least 10 nm wide.

Figure 3:
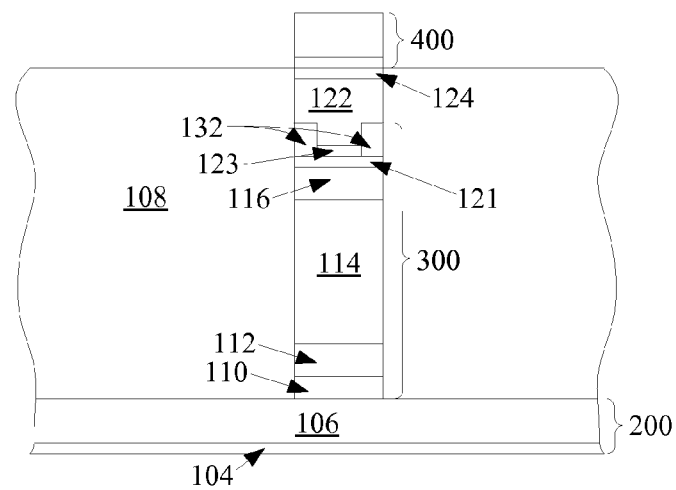
FIG. 3 is a cross-sectional view of another embodiment of the present invention which includes a dielectric rupture antifuse.

Particularly in embodiments having larger feature size, it may be preferred to include a dielectric rupture antifuse above the diode within the reduced recess volume. Turning to FIG. 3, dielectric rupture antifuse 123 can be formed after formation of spacer 132. Dielectric rupture antifuse 123 is preferably an oxide, nitride, or oxynitride layer thermally grown by exposing silicide layer 121 to elevated temperature in an oxygen and/or nitrogen containing ambient. When a large voltage is applied across dielectric rupture antifuse 123, it suffers dielectric breakdown, and one or more conductive rupture regions form through it, serving to focus current. Use of a dielectric rupture antifuse for a similar purpose is described in Scheuerlein et al., U.S. patent application Ser. No. 11/040,255, "A Non-Volatile Memory Cell Comprising a Dielectric Layer and a Phase Change Material in Series," filed Jan. 19, 2005, owned by the assignee of the present invention and hereby incorporated by reference.

A detailed example will be provided describing fabrication of a monolithic three dimensional memory array formed according to one preferred embodiment of the present invention. For completeness, specific process conditions, dimensions, methods, and materials will be provided. It will be understood, however, that such details are not intended to be limiting, and that many of these details can be modified, omitted or augmented while the results still fall within the scope of the invention.

EXAMPLE

Fabrication of a single memory level formed above a substrate will be described in detail. Additional memory levels can be stacked, each monolithically formed above the one below it.

Figure 4A:
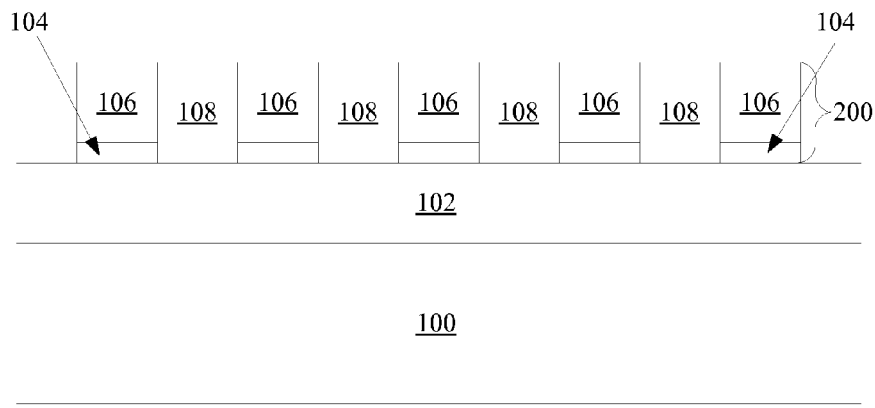
FIGS. 4a through 4f are cross-sectional views showing stages in formation of a memory level in a monolithic three dimensional memory array according to an embodiment of the present invention.

Turning to FIG. 4a, formation of the memory begins with a substrate 100. This substrate 100 can be any semiconducting substrate as known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 may be formed over the substrate 100. The insulating layer 102 can be silicon oxide, silicon nitride, high-dielectric film, Si—C—O—H film, or any other suitable insulating material.

First conductors 200 are formed over the substrate and insulator. An adhesion layer 104 may be included between insulating layer 102 and conducting layer 106 to help conducting layer 106 adhere to insulating layer 102. Adhesion layer 104 may be formed from any appropriate material, for example titanium nitride.

The next layer to be deposited is conducting layer 106. Conducting layer 106 can comprise any appropriate conducting material known in the art; for example, conducting layer 106 can be tungsten.

Once all the layers that will form conductors 200 have been deposited, the layers will be patterned and etched using any suitable masking and etching process to form substantially parallel, substantially coplanar rail-shaped conductors 200, shown in FIG. 4a in cross-section extending out of the page. In one embodiment, photoresist is deposited, patterned by photolithography and the layers etched, and then the photoresist removed using standard process techniques.

Next, dielectric fill material 108 is deposited over and between conductor rails 200. Dielectric fill material 108 can be any known electrically insulating material; for example, dielectric fill material 108 can be silicon dioxide deposited by a high density plasma (HDP) method. The excess dielectric fill material 108 on top of conductor rails 200 is removed to expose the tops of conductor rails 200 separated by a dielectric fill material 108, leaving a substantially planar surface. The resulting structure is shown in FIG. 4a. This removal of dielectric overfill to form the planar surface can be performed by any process known in the art, such as CMP or etchback.

Figure 4B:
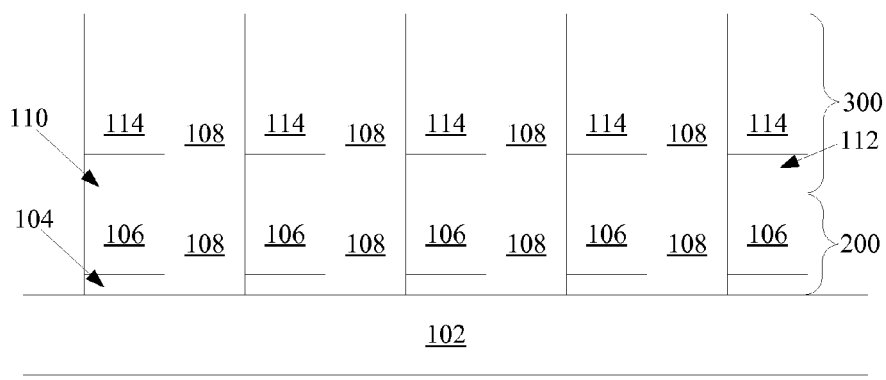

Next, turning to FIG. 4b, vertical pillars will be formed above completed conductor rails 200. To save space, substrate 100 is not shown in FIG. 4b; its presence will be assumed. Preferably a barrier layer 110 is deposited as the first layer after planarization of the conductor rails. Any suitable material conductive material can be used in the barrier layer; for example, titanium nitride can be used. The thickness of titanium nitride layer 110 is preferably from about 50 to about 200 angstroms.

Next, semiconductor material that will be patterned into pillars is deposited. Any suitable semiconductor material can be used, such as silicon, germanium, or silicon-germanium. For simplicity, the following description will generally refer to the semiconductor material as silicon, but it will be understood that other semiconductors or semiconductor alloys are not intended to be excluded.

Heavily doped region 112 is preferably doped in situ by flowing a donor gas providing n-type dopant atoms, for example phosphorus, during deposition of the silicon. The thickness of the bottom heavily doped region 112 may be between about 100 and about 1000 angstroms, preferably about 200 angstroms.

Region 114 is intrinsic silicon, deposited with no added dopant. This region can be formed by any deposition method known in the art. In one embodiment, silicon is deposited without intentional doping, yet has defects which render it slightly n-type. Phosphorus diffuses readily and seeks the surface during deposition; thus phosphorus from region 112 will diffuse into region 114 to some degree. The combined thickness of regions 112 and 114 at this point is preferably between about 1500 and about 5000 angstroms, preferably about 4000 angstroms.

Semiconductor regions 112 and 114 just deposited, along with underlying barrier layer 110, are patterned and etched to form pillars 300. Pillars 300 should have about the same pitch and about the same width as conductors 200 below, such that each pillar 300 is formed on top of a conductor 200. Some misalignment can be tolerated.

Pillars 300 can be formed using any suitable masking and etching process. For example, photoresist can be deposited, patterned using standard photolithography techniques, and etched, and then the photoresist removed. Alternatively, a hard mask of some other material, for example silicon dioxide, can be formed on top of the semiconductor layer stack, with bottom antireflective coating (BARC) on top, then patterned and etched. Similarly, dielectric antireflective coating (DARC) can be used as a hard mask.

The photolithography techniques described in Chen, U.S. patent Ser. No. 10/728,436, "Photomask Features with Interior Nonprinting Window Using Alternating Phase Shifting," filed Dec. 5, 2003; or Chen, U.S. patent application Ser. No. 10/815,312, Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

The width of pillars 300 can be as desired, for example between about 25 nm and about 500 nm, for example about 45, 90, or 130 nm.

Dielectric fill material 108 is deposited over and between semiconductor pillars 300, filling the gaps between them. Next, the dielectric material on top of pillars 300 is removed in a planarization step, exposing the tops of the pillars 300 separated by dielectric fill material 108, and leaving a substantially planar surface. This removal of dielectric overfill and planarization can be performed by any planarizing process known in the art, such as CMP or etchback. The structure at this point is shown in FIG. 4b.

Figure 4C:
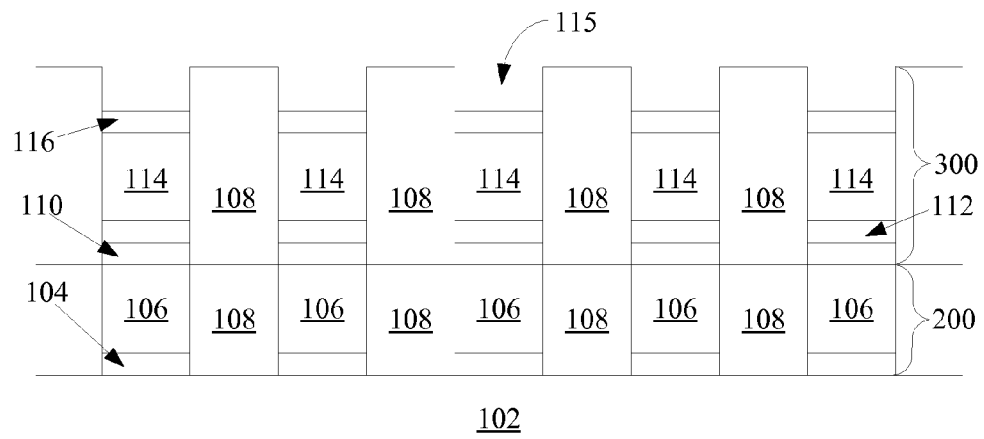

Turning to FIG. 4c, after planarization, a selective etch is preformed, recessing pillars 300 relative to the dielectric fill top surface, forming recess volume 115. Recess volume 115 is between about 100 and about 1000 angstroms deep, preferably about 500 angstroms deep. Some pillar height was lost during the planarization step, as well, so following this etchback, the height of pillars 300 is between about 1000 and about 4400 angstroms, preferably about 3000 angstroms.

Next ion implantation is performed, heavily doping top region 116 of the pillar with a p-type dopant such as boron. Bottom heavily doped n-type region 112, middle intrinsic region 114, and top heavily doped region 116 form a vertically oriented p-i-n diode. The resulting structure is shown in FIG. 4c.

Next a thin layer of about 20 to about 100 angstroms of cobalt (not shown) is deposited. The cobalt can be deposited by any conventional method, for example by sputtering. Other metals that form metal silicides can be used in place of cobalt, including chromium, nickel, platinum, niobium, palladium, tantalum, or titanium. For simplicity, this description will detail the use of cobalt, but it will be understood that any of these other metals can be substituted as appropriate.

Optionally, a capping layer of about 200 angstroms, preferably of titanium or titanium nitride, is deposited on the cobalt (not shown). The titanium or titanium nitride cap assists in the subsequent conversion of the cobalt layer to cobalt silicide.

Figure 4D:
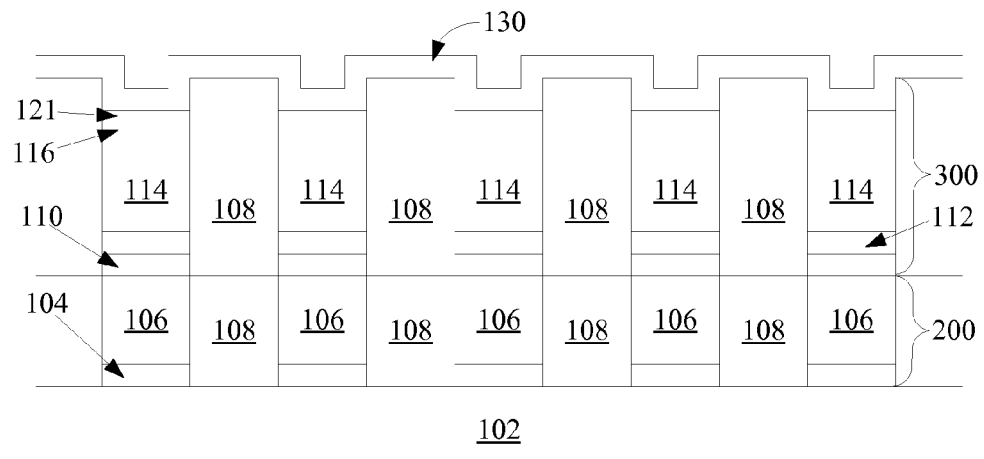

Turning to FIG. 4d, an anneal is performed at a suitable temperature to react the cobalt with the polysilicon of the exposed diodes to form a barrier layer 121 of cobalt silicide where it contacts silicon at the tops of the diodes only; no silicide is formed where the cobalt contacts dielectric fill material 108. For example, the anneal may be performed in a rapid thermal annealing system at about 400 to about 700° C. for about 20 to about 100 seconds, preferably at about 500° C. for about 30 seconds. The capping layer (if present) and unreacted portions of the cobalt may be removed by a selective wet etch. After the selective wet etch, preferably a second anneal is performed to convert cobalt silicide layer 121 to a final, more stable state. Cobalt silicide layer 121 will serve as a barrier layer, preventing contact between heavily doped silicon region 116 and a chalcogenide layer yet to be deposited. Cobalt silicide is an advantageous choice for this barrier layer. Cobalt silicide has lower thermal conductivity compared to other materials with similar electrical conductivity, and thus will provide more heat to the chalcogenide layer, aiding its phase conversion. As noted earlier, the silicon of regions 112, 114, and 116 is amorphous as deposited, and will be crystallized in a later anneal. Because this crystallization step will take place when the silicon is in contact with silicide layer 121, the crystallized diode will be formed of high-quality, low-defect, low-resistivity silicon as formed, before a programming voltage is applied.

Next a thin layer of a conformal dialectic material 130 is deposited on the dielectric fill top surface, on the sidewalls of the recess volume, and on the top surfaces of pillars 200. Dielectric material 130 is a dielectric material with good step coverage that is different from dielectric fill material 108, and should have good etch selectivity with it. A material with good step coverage will deposit with nearly equal thickness on both horizontal and vertical surfaces. If dielectric fill material 108 is silicon dioxide, then silicon nitride is an advantageous choice for conformal dielectric material 130. In an alternative embodiment, the dielectric fill material and the conformal dielectric material can be the same; for example silicon dioxide can be used as conformal dielectric material 130. As described earlier, the relationship between the width of pillars 300 and the thickness of conformal dielectric layer 130 determines how much the contact area between the chalcogenide and the pillar top surface is reduced. Preferably the width of the reduced recess volume will be no at least 5 nm, preferably at least 10 nm. For example, if the width of pillars 300 is about 90 nm, the thickness of conformal dielectric layer is preferably between about 10 nm and about 42 nm, more preferably between about 20 nm and about 40 nm, for example about 30 nm.

Figure 4E:
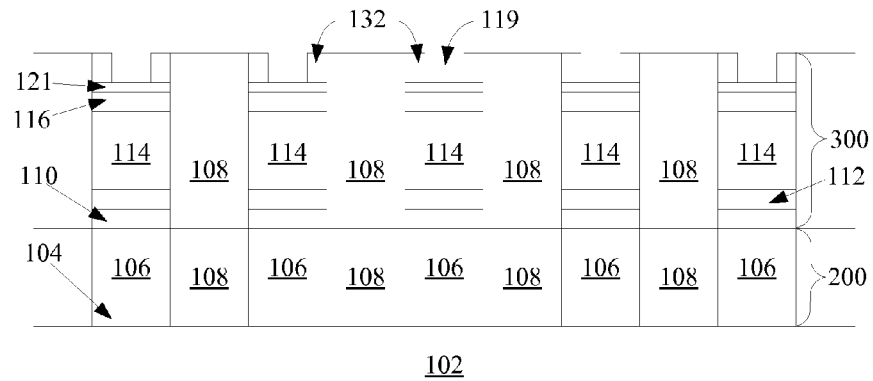

Turning to FIG. 4e, an anisotropic etch is performed on conformal dielectric layer 130 which removes it from horizontal surfaces, such as the pillar top surfaces and the fill top surface, but leaves it on vertical surfaces, such as the recess volume sidewalls. Conventional spacer etch conditions, which typically use fluorocarbon-based chemistry, such as $CF_4/CHF_3$, can be used. After the anisotropic etch, spacers 132, formed of conformal dielectric layer 130 shown in FIG. 4d, remain, defining reduced recess volumes 119. If conformal dielectric material 130 and dielectric fill material 108 are both silicon dioxide, the anisotropic etch is stopped as soon as it is detected that underlying cobalt silicide layer 121 is exposed.

If an optional dielectric rupture antifuse (not shown) is to be included, it should be formed at this point. It may be thermally grown on silicide layer 121. In one embodiment, a silicon dioxide layer which serves as a dielectric rupture antifuse is grown by exposing cobalt silicide layer 121 to an oxygen atmosphere in a rapid thermal annealing system, preferably at about 570° C. to about 800° C. for about 20 to about 60 seconds. In alternative embodiments, this antifuse can be deposited. Reduced recess volume 119 will be further decreased by the thickness of this antifuse layer, however, so the thickness of spacer 132 should be adjusted accordingly, if necessary.

Figure 4F:
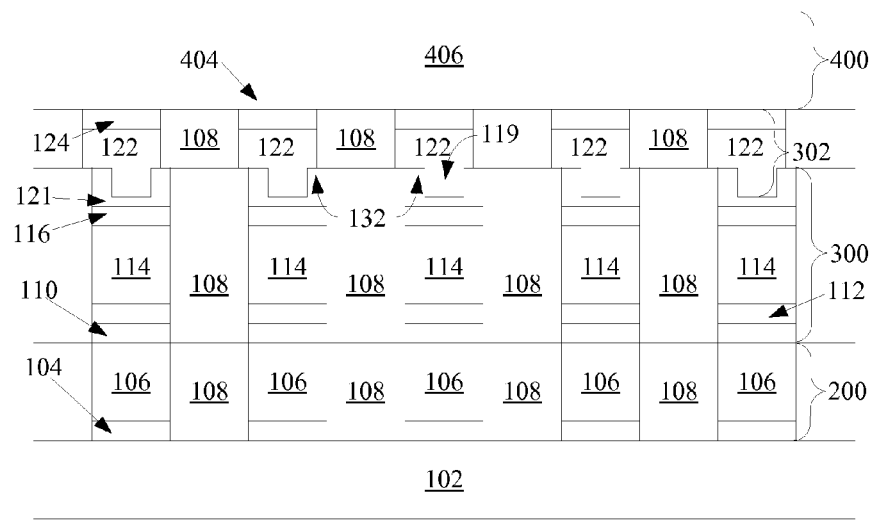

Next, as shown in FIG. 4f, a layer 122 of a phase change material, preferably a chalcogenide material, is formed in reduced recess volume 119. After filling reduced recess volume 119, an additional thickness of phase change material 122 should be deposited such that the total thickness of phase change material layer ranges from about 200 to about 2000 angstroms. The phase change material 122 can be any chalcogenide material, for example any suitable compound of germanium (Ge), antimony (Sb) and tellurium (Te); such a compound is referred to as a GST material. The phase change layer 122 can be formed by any conventional method. One of the most commonly used chalcogenide materials, $Ge_2Sb_2Te_5$, has a melting temperature of 610 degrees C. The temperature required to crystallize silicon using conventional methods generally exceed 610 degrees C. Germanium and silicon-germanium alloys crystallize at lower temperatures than silicon, and may be preferred for use in pillars 300, reducing the temperature required to form this and subsequent memory levels.

A layer 124 of a conductive CMP stop material is preferably deposited on the phase change layer 122. Any suitable material can be used in the CMP stop layer; titanium nitride is preferred. This CMP stop layer 124 is preferably between about 500 and about 1000 angstroms thick, for example about 800 angstroms thick.

Next CMP stop layer 124 and phase change layer 122 are patterned and etched, preferably in the form of short pillars 302. The same photomask used to pattern pillars 300 can be reused in this photolithography step. Chen et al., U.S. patent application Ser. No. 11/097,496, "Masking of Repeated Overlay and Alignment Marks to Allow Reuse of Photomasks in a Vertical Structure," filed Mar. 31, 2005, owned by the assignee of the present invention and hereby incorporated by reference, describes methods to avoid problems which may be encountered when the reusing photomasks. Ideally short pillars 302 of CMP stop layer 124 and phase change material 122 and pillars 300 are perfectly aligned, but it is only essential that the etched phase change material elements 122 overlap spacers 132. Thus spacers 132 allow for substantial misalignment of pillars 300 and short pillars 302 to be tolerated. Some misalignment is shown in FIG. 4f.

After etch, dielectric fill material 108 is deposited over and between short pillars 302, filling gaps between them. A planarization step, for example by CMP, removes overfill and exposes CMP stop layer 124 at a substantially planar surface. Note that CMP stop layer 124 is not essential and in some embodiments may be omitted. It provides several advantages, however. Although the CMP step ideally stops as soon as CMP stop layer 124 is exposed, in reality there will be some degree of overplanarization, and some thickness of layer 124 will be removed. In practice this thickness may be as much as 500 angstroms or more, and may not be uniform across a wafer. Because the CMP step is performed on titanium nitride layer 124 rather than on chalcogenide layer 122, the thickness of chalcogenide layer 122 is relatively uniform across the wafer, contributing to device uniformity. In addition, chalcogenide can be difficult to polish and clean; this is avoided by use of a titanium nitride CMP stop layer 124.

Top conductors are to be formed next. Top conductors are preferably formed of the same materials and in the same manner as bottom conductors 200. For example, titanium nitride adhesion layer 404 and tungsten conducting layer 406 can be deposited above the planar surface of dielectric fill material 108 at which short pillars 302 are exposed. Tungsten layer 406 and titanium nitride layer 404 are then patterned and etched to form substantially parallel, substantially coplanar conductors 400, shown in FIG. 4f extending left-to-right across the page.

The structure shown in FIG. 4f is a first memory level. This structure can be varied in many ways. For example, in one alternative shown in FIG. 5, deposition of chalcogenide layer 122 is followed by deposition of a barrier layer 126, for example of titanium nitride (this layer serves as a chemical barrier between chalcogenide layer 122 and an overlying conductor, and can be from 20 to 1000 angstroms thick, preferably between about 100 to about 200 angstroms thick.) Conducting layer 406 is deposited on barrier layer 126. Conducting layer 406, barrier layer 126, and chalcogenide layer 122 are patterned and etched to form top conductors 400. Many other configurations are possible.

Figure 5:
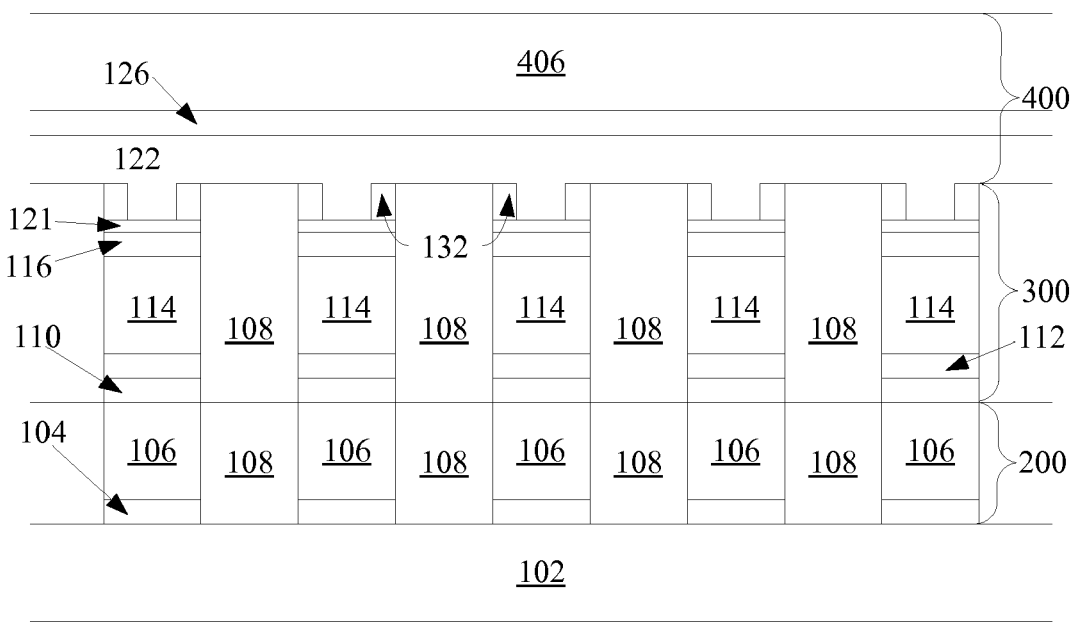
FIG. 5 is a cross-sectional view showing a memory level in a monolithic three dimensional memory array according to an alternative embodiment of the present invention.

Next, in the embodiment of either FIG. 4f or FIG. 5, a dielectric material (not shown) is deposited over and between conductor rails 400. The dielectric material can be any known electrically insulating material, such as silicon oxide, silicon nitride, or silicon oxynitride. In a preferred embodiment, HDP oxide is used as this dielectric material.

While the structure of the array just described diverges in some important ways from the structure of the array described in Herner et al., U.S. Pat. No. 6,952,030, hereinafter the '030 patent (owned by the assignee of the present invention and hereby incorporated by reference) and in the '510 application and the '530 application, wherever they are the same, the fabrication methods of these applications and this patent can be used. For clarity, not all of the fabrication details of these applications and patent have been included, but none of their teachings is intended to be excluded.

Each of the structures shown in FIGS. 4f and 5 is a first memory level. Additional memory levels can be monolithically formed above this memory level to form a monolithic three dimensional memory array. In some embodiments, an interlevel dielectric separates memory levels, which do not share conductors. In other embodiments, conductors may be shared; for example top conductors 400 may serve as the bottom conductors of the next memory level.

A monolithic three dimensional memory array is one in which multiple memory levels are formed above a single substrate, such as a wafer, with no intervening substrates. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array. In other embodiments, only a single memory level may be formed as described, without additional stacked memory levels formed above the first memory level.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A nonvolatile memory cell comprising:
    a pillar comprising a conductive or semiconductor material, the pillar having a pillar sidewall and comprising a vertically oriented diode;
    a dielectric spacer above the pillar, the dielectric spacer having an outer sidewall and an inner sidewall, wherein the inner sidewall defines a reduced recess volume;
    a phase-change material, wherein some portion of the phase-change material is within the reduced recess volume;
    a dielectric fill material surrounding the pillar and the dielectric spacer, and
    a silicide-germanide layer between the pillar and the phase-change material and in direct physical contact with a bottom surface of the phase-change material.

2. The nonvolatile memory cell of claim 1 wherein the dielectric fill material is silicon dioxide.

3. The nonvolatile memory cell of claim 1 wherein the vertically oriented diode is a p-i-n diode formed of semiconductor material.

4. The nonvolatile memory cell of claim 1, the silicide-germanide layer in contact with a top surface of the pillar.

5. A nonvolatile memory cell comprising:
    a pillar comprising a conductive or semiconductor material, the pillar having a pillar sidewall;
    a dielectric spacer above the pillar, the dielectric spacer having an outer sidewall and an inner sidewall, wherein the inner sidewall defines a reduced recess volume;
    a phase-change material, wherein some portion of the phase-change material is within the reduced recess volume;
    a dielectric fill material surrounding the pillar and the dielectric spacer, and
    a silicide-germanide layer comprising titanium silicide-germanide or cobalt silicide-germanide and between the pillar and the phase-change material and in direct physical contact with a bottom surface of the phase-change material.

6. The nonvolatile memory cell of claim 1 wherein the phase change-material and the vertically oriented diode are arranged in series between a bottom conductor and a top conductor.

7. The nonvolatile memory cell of claim 1 wherein the phase-change material is a chalcogenide.

8. The nonvolatile memory cell of claim 7 wherein the chalcogenide comprises a GST material.

9. A monolithic three dimensional memory array comprising:
    a) a first memory level, the first memory level comprising:
        i) a plurality of pillars, each pillar comprising a conductive or semiconductor material, and having a pillar sidewall and comprising a vertically oriented diode
        ii) a plurality of dielectric spacers, each dielectric spacer above one of the pillars, each dielectric spacer having an outer sidewall and an inner sidewall, wherein each inner sidewall defines a reduced recess volume;
        iii) a plurality of phase-change elements, wherein some portion of each of the phase-change elements is within the reduced recess volume; and
        iv) a dielectric fill material surrounding the pillars and the dielectric spacers; and
    b) a second memory level monolithically formed above the first memory level, where a silicide or germanide layer is disposed between respective pillars and phase-change elements and is in direct physical contact with a bottom surface of respective phase-change elements.

10. The monolithic three dimensional memory array of claim 9 wherein each of the pillars comprise a vertically oriented diode.

11. The monolithic three dimensional memory array of claim 10 wherein the first memory level further comprises a plurality of first memory cells, each first memory cell comprising one of the pillars and one of the phase-change elements.

12. The monolithic three dimensional memory array of claim 9 wherein each of the phase-change elements comprises a chalcogenide.

13. The monolithic three dimensional memory array of claim 12 wherein the chalcogenide is a GST material.

14. The monolithic three dimensional memory array of claim 13 wherein the GST material is $Ge_2Sb_2Te_5$.

15. A memory cell comprising:
- a pillar comprising a conductive or semiconductor material, and having a pillar sidewall;
- a dielectric spacer above the pillar, the dielectric spacer having an outer sidewall and an inner sidewall having a height, wherein the inner sidewall defines a reduced recess volume;
- a phase-change element, wherein some portion of the phase-change element is within the reduced recess volume;
- an antifuse within the reduced recess volume between the pillar and the phase change element;
- a dielectric fill material surrounding the pillar and the dielectric spacer; and
- a silicide or germanide layer between the pillar and the phase-change material.

16. The memory cell of claim 15, the silicide or germanide layer in direct physical contact with a bottom surface of the antifuse.

17. The memory cell of claim 16, the silicide or germanide layer between the pillar and the antifuse.

18. The memory cell of claim 17, the silicide or germanide layer not within the reduced recess volume.

* * * * *

UNITED STATES PATENT AND TRADEMARK OFFICE
CERTIFICATE OF CORRECTION

| | | |
|---|---|---|
| PATENT NO. | : 7,728,318 B2 | Page 1 of 1 |
| APPLICATION NO. | : 11/560791 | |
| DATED | : June 1, 2010 | |
| INVENTOR(S) | : Usha Raghuram and Brad Herner | |

It is certified that error appears in the above-identified patent and that said Letters Patent is hereby corrected as shown below:

Column 12, line 53

Please replace "sidewall and comprising a vertically oriented diode" with
--sidewall and comprising a vertically oriented diode;--

Signed and Sealed this

Fourteenth Day of September, 2010

David J. Kappos
*Director of the United States Patent and Trademark Office*